United States Patent
Tomita

(10) Patent No.: US 11,967,568 B2
(45) Date of Patent: Apr. 23, 2024

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Kouta Tomita, Nonoichi Ishikawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 73 days.

(21) Appl. No.: 17/681,469

(22) Filed: Feb. 25, 2022

(65) Prior Publication Data
US 2023/0089797 A1 Mar. 23, 2023

(30) Foreign Application Priority Data

Sep. 17, 2021 (JP) .................. 2021-152686

(51) Int. Cl.
*H01L 23/00* (2006.01)
*H01L 21/02* (2006.01)

(52) U.S. Cl.
CPC ........ *H01L 23/564* (2013.01); *H01L 21/0214* (2013.01)

(58) Field of Classification Search
CPC ............... H01L 23/564; H01L 21/0214; H01L 29/7811; H01L 23/3171; H01L 23/562; H01L 23/3192
See application file for complete search history.

(56) References Cited

U.S. PATENT DOCUMENTS

| | | | |
|---|---|---|---|
| 5,650,360 A | 7/1997 | Tomita | |
| 2014/0197476 A1* | 7/2014 | Shimatou | H01L 29/404 |
| | | | 257/329 |
| 2017/0077218 A1 | 3/2017 | Nishikawa et al. | |
| 2020/0203491 A1 | 6/2020 | Takahashi et al. | |

FOREIGN PATENT DOCUMENTS

| | | |
|---|---|---|
| EP | 1039530 A2 | 9/2000 |
| JP | H03-244126 A | 10/1991 |
| JP | H08-222559 A | 8/1996 |
| JP | 2000-260768 A | 9/2000 |
| JP | 2017-055015 A | 3/2017 |
| JP | 2020-102547 A | 7/2020 |

* cited by examiner

*Primary Examiner* — Samuel A Gebremariam
(74) *Attorney, Agent, or Firm* — Kim & Stewart LLP

(57) ABSTRACT

A semiconductor device of embodiments includes: a semiconductor layer; a first insulating layer provided on the semiconductor layer; a first metal layer provided on the first insulating layer and containing aluminum (Al); a second metal layer provided on the first insulating layer and containing aluminum (Al); and a second insulating layer provided on the first insulating layer, provided between the first metal layer and the second metal layer, having a top surface in contact with a side surface of the first metal layer and a side surface of the second metal layer, and containing silicon (Si) and nitrogen (N).

10 Claims, 16 Drawing Sheets

AA' CROSS SECTION

SECOND DIRECTION

BB' CROSS SECTION

SEMICONDUCTOR DEVICE

CROSS-REFERENCE TO RELATED APPLICATION

This application is based upon and claims the benefit of priority from Japanese Patent Application No. 2021-152686, filed on Sep. 17, 2021, the entire contents of which are incorporated herein by reference.

FIELD

Embodiments described herein relate generally to a semiconductor device.

BACKGROUND

When moisture or movable ions invade a semiconductor device, the device characteristics fluctuate to reduce the reliability of the semiconductor device. For this reason, for example, a protective insulating layer formed of silicon nitride is formed on the surface of the semiconductor device in order to suppress the invasion of moisture or movable ions into the semiconductor device.

DETAILED DESCRIPTION

Figure 1:
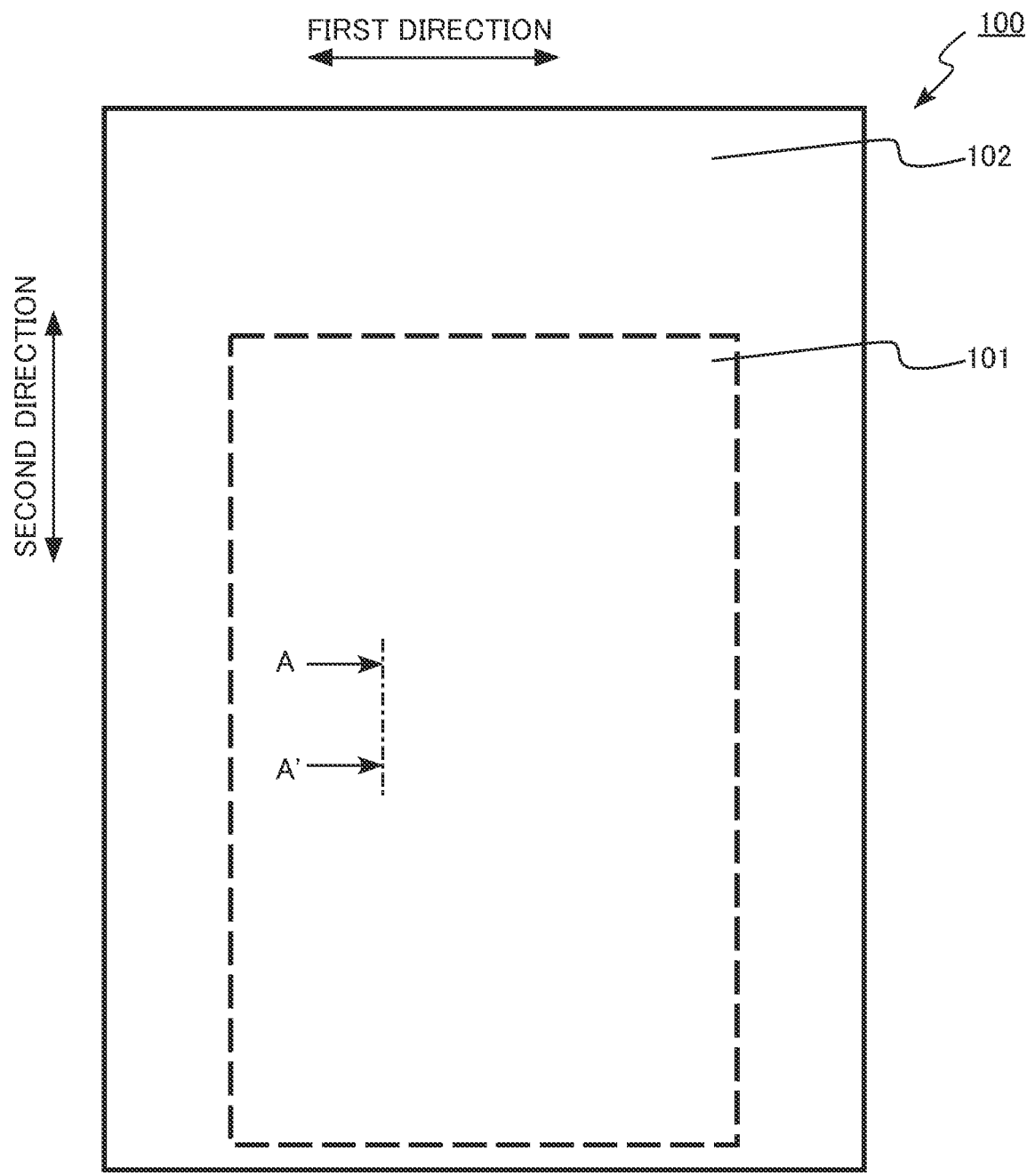
FIG. 1 is a chip image diagram of a semiconductor device of embodiments.

A semiconductor device of embodiments includes: a semiconductor layer; a first insulating layer provided on the semiconductor layer; a first metal layer provided on the first insulating layer and containing aluminum (Al); a second metal layer provided on the first insulating layer and containing aluminum (Al); and a second insulating layer provided on the first insulating layer, provided between the first metal layer and the second metal layer, having a top surface in contact with a side surface of the first metal layer and a side surface of the second metal layer, and containing silicon (Si) and nitrogen (N).

Hereinafter, embodiments will be described with reference to the diagrams. In the following description, the same or similar members and the like may be denoted by the same reference numerals, and the description of the members and the like once described may be omitted as appropriate.

In addition, in the following description, when there are notations of $n^+$, n, $n^-$, $p^+$, p, and $p^-$, these notations indicate the relative high and low of the impurity concentration in each conductive type. That is, $n^+$ indicates that the n-type impurity concentration is relatively higher than n, and $n^-$ indicates that the n-type impurity concentration is relatively lower than n. In addition, $p^+$ indicates that the p-type impurity concentration is relatively higher than p, and $p^-$ indicates that the p-type impurity concentration is relatively lower than p. In addition, $n^+$-type and $n^-$-type may be simply described as n-type, $p^+$ t-type and $p^-$-type may be simply described as p-type.

The thickness or the like of a metal layer or an insulating layer in this specification can be measured, for example, on an image of SEM or transmission electron microscope (TEM). In addition, qualitative analysis and quantitative analysis of the chemical composition of the members forming the semiconductor device can be performed by, for example, SIMS, electron energy loss spectroscopy (EELS), and energy dispersive X-ray spectroscopy (EDX).

A semiconductor device of embodiments includes: a semiconductor layer; a first insulating layer provided on the semiconductor layer; a first metal layer provided on the first insulating layer and containing aluminum (Al); a second metal layer provided on the first insulating layer and containing aluminum (Al); and a second insulating layer provided on the first insulating layer, provided between the first metal layer and the second metal layer, having a top surface in contact with a side surface of the first metal layer and a side surface of the second metal layer, and containing silicon (Si) and nitrogen (N).

Figure 2:
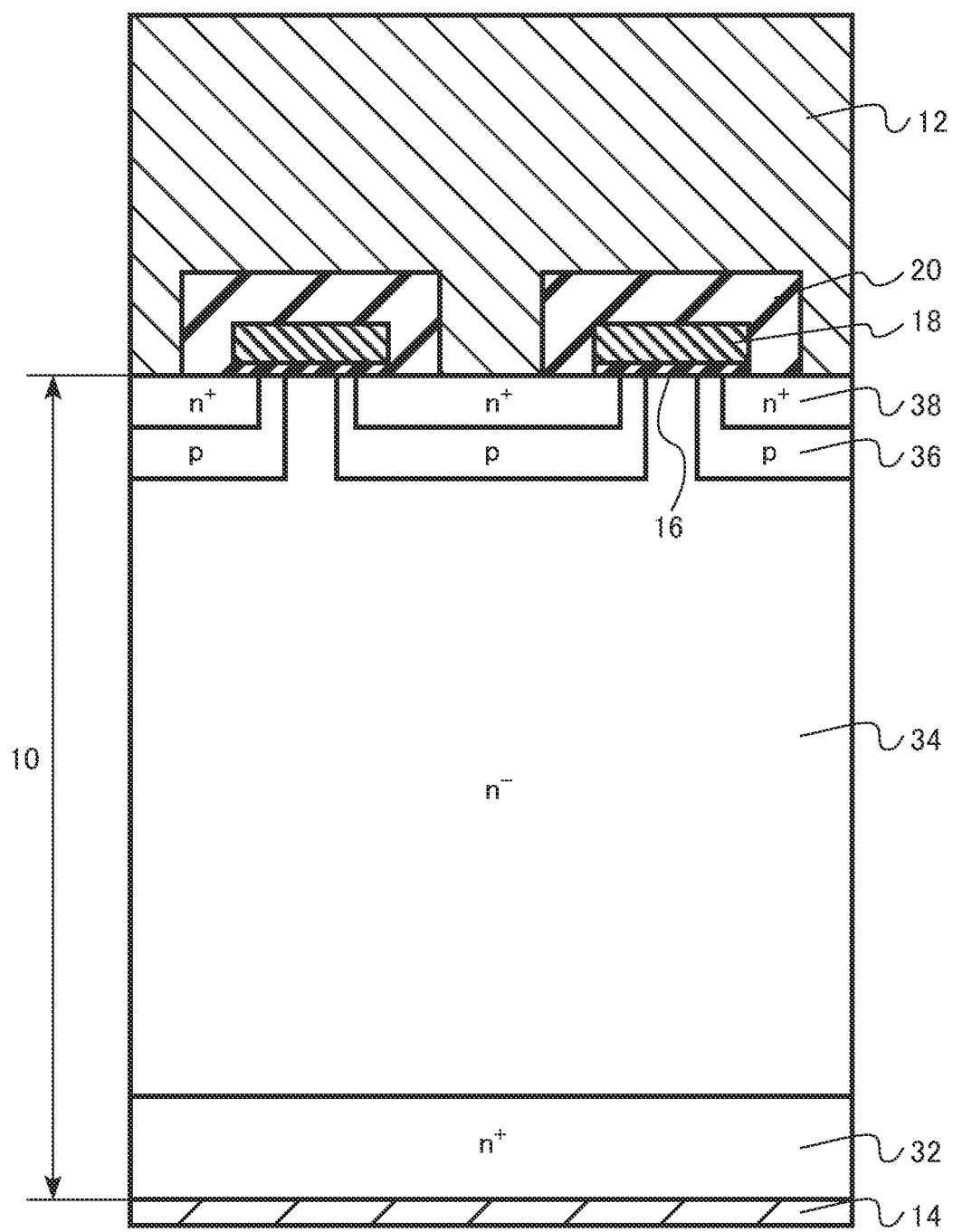
FIG. 2 is an enlarged schematic cross-sectional view of the semiconductor device of embodiments.

FIG. 1 is a chip image diagram of a semiconductor device of embodiments. FIG. 1 is a diagram showing the relationship between an element region and a termination region of the semiconductor device of embodiments. FIG. 2 is an enlarged schematic cross-sectional view of the semiconductor device of embodiments. FIG. 2 is a cross-sectional view of the element region of the semiconductor device of embodiments. FIG. 2 is a cross-sectional view taken along the line AA' of FIG. 1.

Figure 3A:
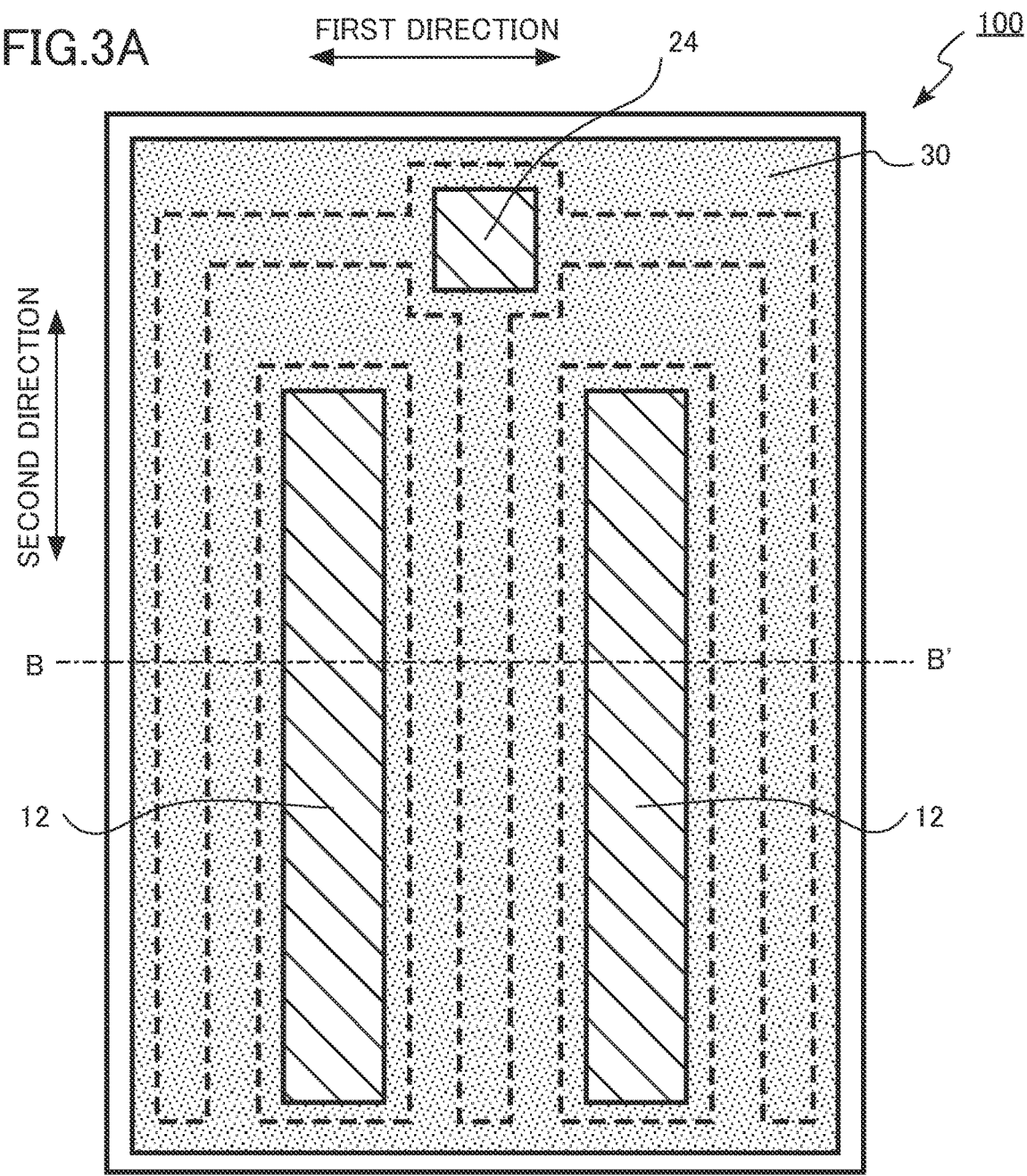
FIGS. 3A and 3B are schematic diagrams of the semiconductor device of embodiments.
Figure 3B:
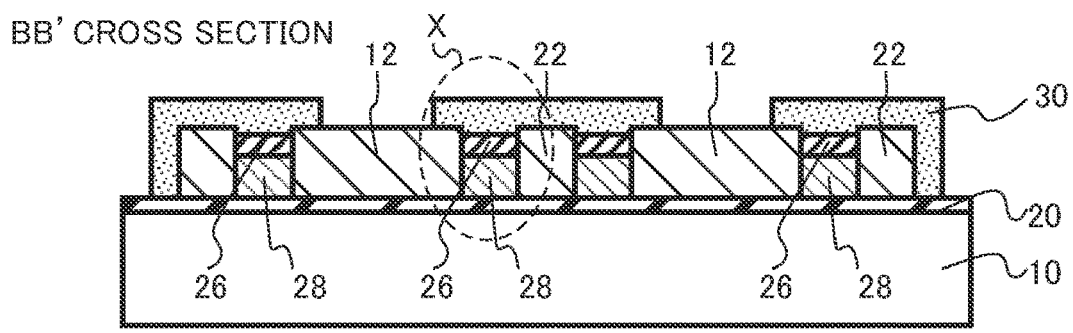

FIGS. 3A and 3B are schematic diagrams of the semiconductor device of embodiments. FIG. 3A is a top view, and FIG. 3B is a cross-sectional view. FIG. 3B is a cross-sectional view taken along the line BB' of FIG. 3A.

Figure 4:
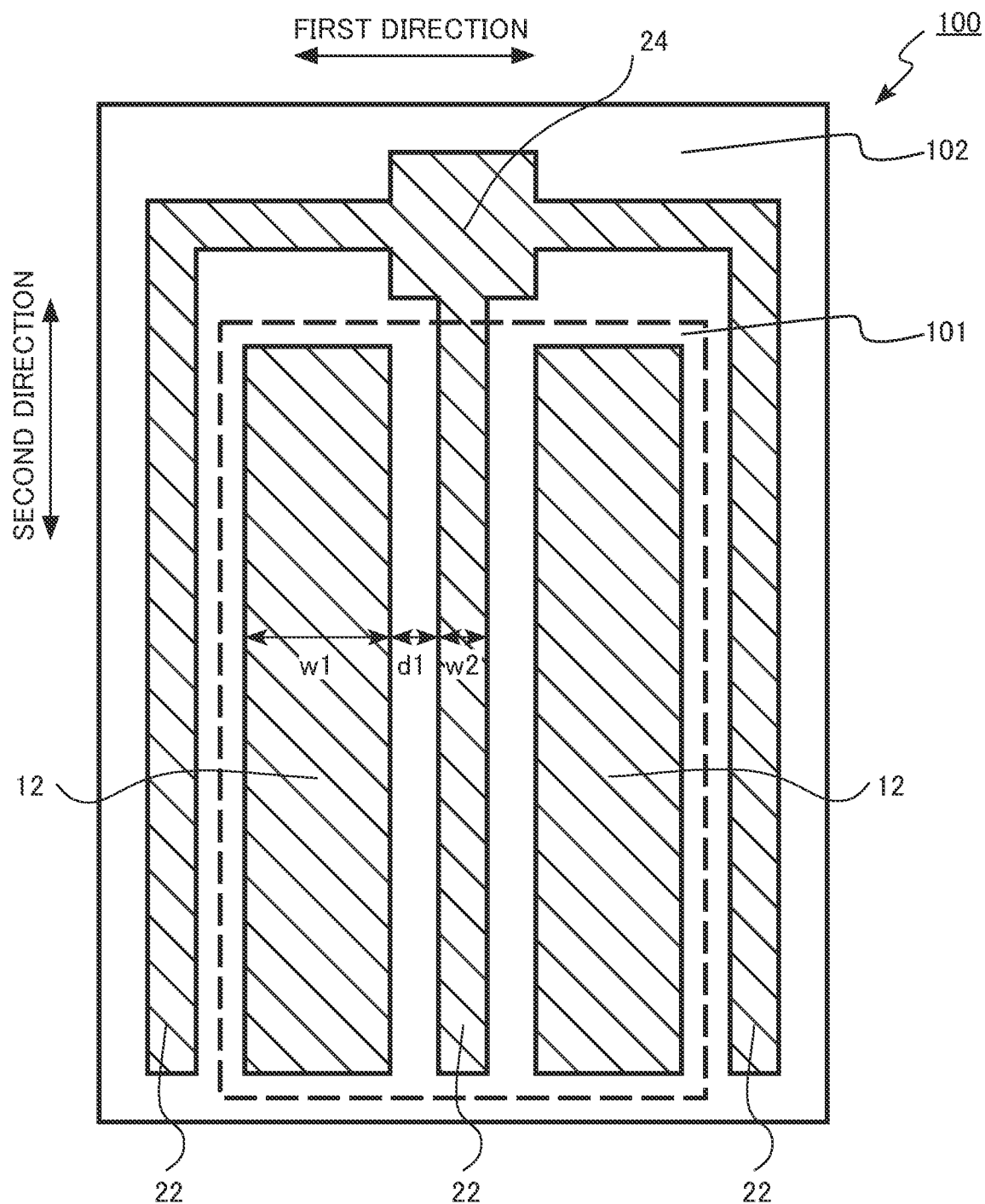
FIG. 4 is a schematic top view of the semiconductor device of embodiments.

FIG. 4 is a schematic top view of the semiconductor device of embodiments. FIG. 4 is a diagram in which a resin layer is removed from FIG. 3A.

Figure 5:
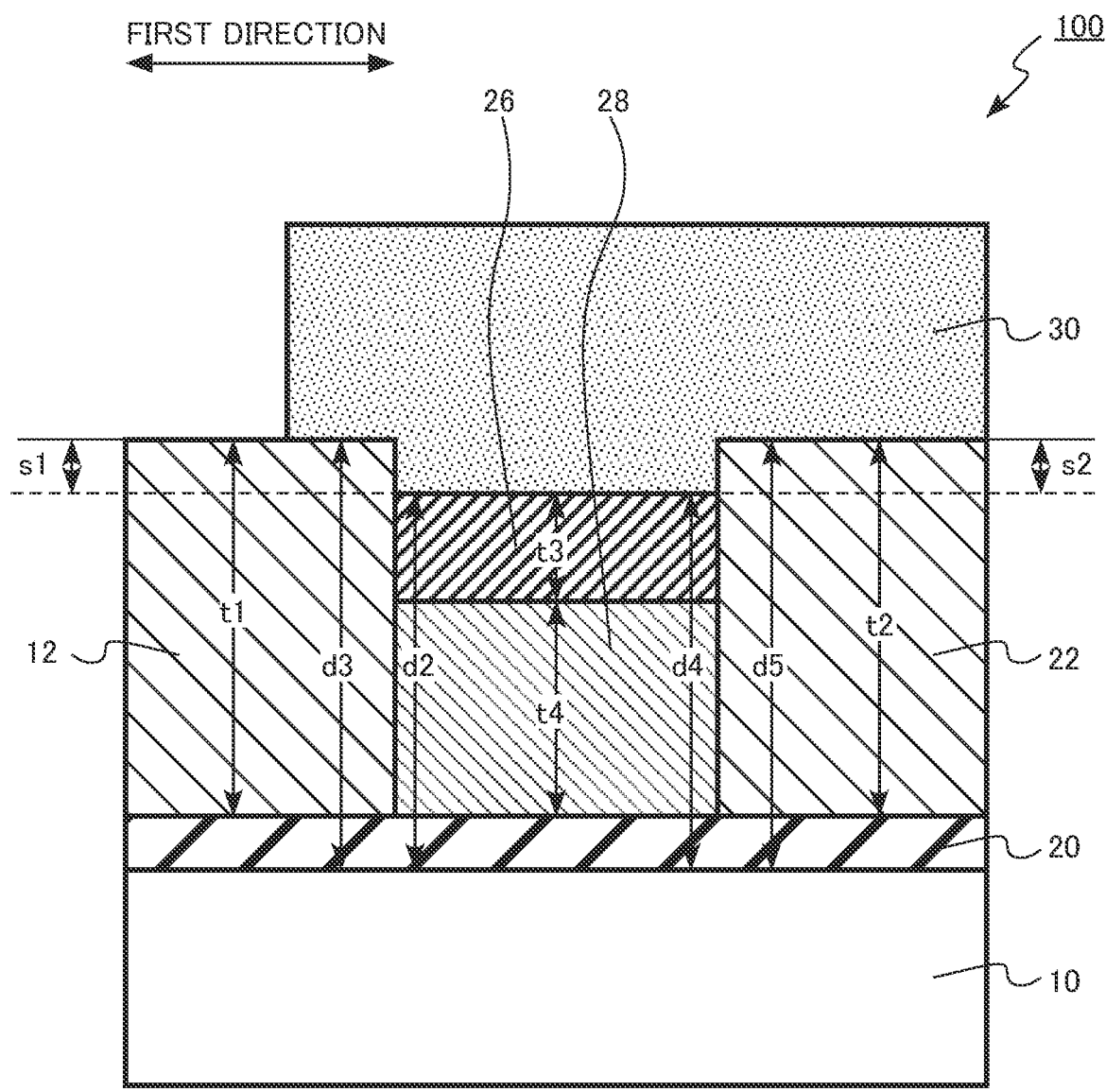
FIG. 5 is an enlarged schematic cross-sectional view of the semiconductor device of embodiments.

FIG. 5 is an enlarged schematic cross-sectional view of the semiconductor device of embodiments. FIG. 5 is an enlarged view of a region X shown in FIG. 3B.

The semiconductor device of embodiments is a metal oxide semiconductor field effect transistor (MOSFET). The semiconductor device of embodiments is a planar gate type vertical MOSFET 100 for high breakdown voltage applications. The MOSFET 100 is a power semiconductor device. The MOSFET 100 is a vertical n-channel MOSFET having electrons as carriers.

As shown in FIG. 1, the MOSFET 100 of embodiments includes an element region 101 and a termination region 102. A transistor is provided in the element region 101. The termination region 102 surrounds the element region 101. A structure (not shown) for improving the breakdown voltage of the MOSFET 100 is provided in the termination region 102. The structure for improving the breakdown voltage of the MOSFET 100 is, for example, a resurf or a guard ring.

Hereinafter, as shown in FIG. 1, one direction parallel to the chip surface of the MOSFET 100 is defined as a first direction, and a direction parallel to the chip surface of the MOSFET 100 and perpendicular to the first direction is defined as a second direction.

The MOSFET 100 includes a semiconductor layer 10, a source electrode 12 (first metal layer), a drain electrode 14 (third metal layer), a gate insulating layer 16, a gate electrode 18, an interlayer insulating layer 20 (first insulating layer), a gate wiring 22 (second metal layer), a gate pad 24, a first protective insulating layer 26 (second insulating layer), a second protective insulating layer 28 (third insulating layer), and a polyimide layer 30 (resin layer).

The semiconductor layer 10 is, for example, single crystal silicon. The semiconductor layer 10 includes a drain region 32 of $n^+$-type, a drift region 34 of $n^-$-type, a body region 36 of p-type, and a source region 38 of $n^+$-type.

The source electrode 12 is an example of the first metal layer. The drain electrode 14 is an example of the third metal layer. The interlayer insulating layer 20 is an example of the first insulating layer. The gate wiring 22 is an example of the second metal layer. The first protective insulating layer 26 is an example of the second insulating layer. The second protective insulating layer 28 is an example of the third insulating layer. The polyimide layer 30 is an example of the resin layer.

As shown in FIG. 2, a vertical transistor is formed in the element region 101 of the MOSFET 100. The source electrode 12, the drain electrode 14, the gate insulating layer 16, the gate electrode 18, the drain region 32 of $n^+$-type, the drift region 34 of $n^-$-type, the body region 36 of p-type, and the source region 38 of $n^+$-type form a vertical transistor.

The semiconductor layer 10 is provided between the source electrode 12 and the drain electrode 14. The gate insulating layer 16 is provided between the gate electrode 18 and the semiconductor layer 10. The gate electrode 18 is provided between the interlayer insulating layer 20 and the semiconductor layer 10. The interlayer insulating layer 20 is provided between the source electrode 12 and the gate electrode 18.

The drain electrode 14 is electrically connected to the semiconductor layer 10. The drain electrode 14 is electrically connected to the drain region 32. The drain electrode 14 is in contact with the semiconductor layer 10.

The interlayer insulating layer 20 is provided on the semiconductor layer 10. The interlayer insulating layer 20 is provided on the gate electrode 18. The interlayer insulating layer 20 has a function of electrically separating the gate electrode 18 and the source electrode 12 from each other.

The interlayer insulating layer 20 contains, for example, silicon (Si) and oxygen (O). The interlayer insulating layer 20 contains, for example, silicon oxide. The interlayer insulating layer 20 is, for example, a silicon oxide layer.

The source electrode 12 is provided in the element region 101. The source electrode 12 is provided on the interlayer insulating layer 20. The source electrode 12 is provided on the semiconductor layer 10.

The source electrode 12 is electrically connected to the semiconductor layer 10. The source electrode 12 is electrically connected to the source region 38. The source electrode 12 is in contact with the semiconductor layer 10.

The source electrode 12 contains aluminum (Al). The source electrode 12 is, for example, an aluminum layer. The source electrode 12 may have a stacked structure of a barrier metal layer and an aluminum layer. The barrier metal layer is, for example, a titanium layer or a titanium nitride layer.

The thickness (t1 in FIG. 5) of the source electrode 12 is equal to or more than 1 μm and equal to or less than 10 μm, for example. The width (w1 in FIG. 4) of the source electrode 12 in the first direction is equal to or more than 100 μm and equal to or less than 500 μm, for example.

The gate wiring 22 is provided in the element region 101 or the termination region 102. The gate wiring 22 is provided on the interlayer insulating layer 20. The gate wiring 22 is provided on the semiconductor layer 10.

The gate wiring 22 is electrically connected to the gate electrode 18. The gate wiring 22 has a function of applying a gate voltage to the gate electrode 18 in the element region 101.

The gate wiring 22 contains aluminum (Al). The gate wiring 22 is, for example, an aluminum layer. The gate wiring 22 may have a stacked structure of a barrier metal layer and an aluminum layer. The barrier metal layer is, for example, a titanium layer or a titanium nitride layer.

The gate wiring 22 is formed of, for example, the same material as the source electrode 12.

The thickness (t2 in FIG. 5) of the gate wiring 22 is equal to or more than 1 μm and equal to or less than 10 μm, for example. The width (w2 in FIG. 4) of the gate wiring 22 in the first direction is equal to or more than 1 μm and equal to or less than 20 μm, for example.

A first distance (d1 in FIG. 4) between the source electrode 12 and the gate wiring 22 in the first direction is equal to or more than 1 μm and equal to or less than 10 μm, for example.

The gate pad 24 is provided in the termination region 102. The gate pad 24 is provided on the interlayer insulating layer 20. The gate pad 24 is provided on the semiconductor layer 10.

The gate pad 24 is connected to the gate wiring 22. The gate pad 24 has a function of applying a gate voltage to the gate electrode 18 through the gate wiring 22. For example, a bonding wire is connected to the gate pad 24.

The gate pad 24 contains aluminum (Al). The gate pad 24 is, for example, an aluminum layer. The gate pad 24 may have a stacked structure of a barrier metal layer and an aluminum layer. The barrier metal layer is, for example, a titanium layer or a titanium nitride layer.

The gate pad 24 is formed of, for example, the same material as the source electrode 12 and the gate wiring 22.

The first protective insulating layer 26 is provided on the interlayer insulating layer 20. The first protective insulating layer 26 is provided on the second protective insulating layer 28. The first protective insulating layer 26 is provided between the source electrode 12 and the gate wiring 22.

The first protective insulating layer 26 has a function of suppressing the invasion of moisture or movable ions into the element region 101. By providing the first protective insulating layer 26, fluctuations in the characteristics of the MOSFET 100 are suppressed, so that the reliability of the MOSFET 100 is improved.

The first protective insulating layer 26 contains silicon (Si) and nitrogen (N). The first protective insulating layer 26 contains, for example, silicon nitride. The first protective insulating layer 26 is, for example, a silicon nitride layer.

The first protective insulating layer 26 contains, for example, silicon (Si), nitrogen (N), and oxygen (O). The first protective insulating layer 26 contains, for example, silicon oxynitride. The first protective insulating layer 26 is, for example, a silicon oxynitride layer.

The thickness (t3 in FIG. 5) of the first protective insulating layer 26 is equal to or more than 0.1 μm and equal to or less than 2 μm, for example.

The top surface of the first protective insulating layer 26 is in contact with the side surface of the source electrode 12. The first protective insulating layer 26 is not in contact with the top surface of the source electrode 12. The first protective insulating layer 26 is not provided on the source electrode 12.

A second distance (d2 in FIG. 5) from the surface of the semiconductor layer 10 to a position where the top surface of the first protective insulating layer 26 is in contact with the side surface of the source electrode 12 is smaller than a third distance (d3 in FIG. 5) from the surface of the semiconductor layer 10 to the top surface of the source electrode 12. The difference (s1 in FIG. 5) between the third distance d3 and the second distance d2 is equal to or more than 0.1 μm and equal to or less than 1 μm, for example.

The top surface of the first protective insulating layer 26 is in contact with the side surface of the gate wiring 22. The first protective insulating layer 26 is not in contact with the top surface of the gate wiring 22. The first protective insulating layer 26 is not provided on the gate wiring 22.

A fourth distance (d4 in FIG. 5) from the surface of the semiconductor layer 10 to a position where the top surface of the first protective insulating layer 26 is in contact with the side surface of the gate wiring 22 is smaller than a fifth distance (d5 in FIG. 5) from the surface of the semiconductor layer 10 to the top surface of the gate wiring 22. The difference (s2 in FIG. 5) between the fifth distance d5 and the fourth distance d4 is equal to or more than 0.1 μm and equal to or less than 1 μm, for example.

The second protective insulating layer 28 is provided on the interlayer insulating layer 20. The second protective insulating layer 28 is provided between the interlayer insulating layer 20 and the first protective insulating layer 26.

The second protective insulating layer 28 contains, for example, silicon (Si) and oxygen (O). The second protective insulating layer 28 contains, for example, silicon oxide. The second protective insulating layer 28 is, for example, a silicon oxide layer.

The thickness (t4 in FIG. 5) of the second protective insulating layer 28 is equal to or more than 0.1 μm and equal to or less than 2 μm, for example.

The thickness t3 of the first protective insulating layer 26 is smaller than the thickness t4 of the second protective insulating layer 28, for example.

The second protective insulating layer 28 is in contact with the side surface of the source electrode 12. The second protective insulating layer 28 is in contact with the side surface of the gate wiring 22.

The polyimide layer 30 is provided on the source electrode 12. The polyimide layer 30 is provided on the gate wiring 22. The polyimide layer 30 is provided on the first protective insulating layer 26.

The polyimide layer 30 is in contact with the top surface and the side surface of the source electrode 12. The polyimide layer 30 covers the corners of the top surface and the side surface of the source electrode 12.

The polyimide layer 30 is in contact with the top surface and the side surface of the gate wiring 22. The polyimide layer 30 covers the corners of the top surface and the side surface of the gate wiring 22.

The thickness of the polyimide layer 30 is equal to or more than 3 μm and equal to or less than 10 μm, for example.

Next, an example of a method of manufacturing the semiconductor device of embodiments will be described. In particular, a method of forming the first protective insulating layer 26 and the second protective insulating layer 28 will be described.

FIGS. 6 to 11 are schematic cross-sectional views showing an example of a method of manufacturing the semiconductor device of embodiments. FIGS. 6 to 11 are cross-sectional views corresponding to FIG. 5.

Figure 6:
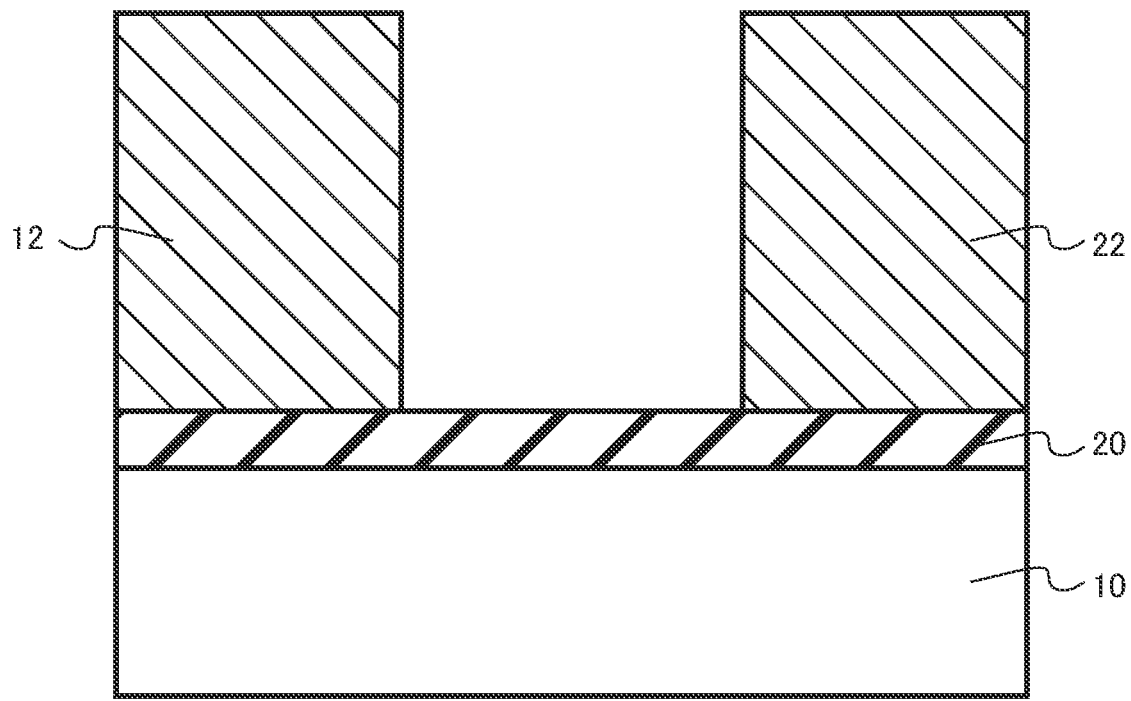
FIG. 6 is a schematic cross-sectional view showing an example of a method of manufacturing the semiconductor device of embodiments.

The interlayer insulating layer 20 is formed on the semiconductor layer 10 by using a known process technique. Then, the source electrode 12 and the gate wiring 22 are formed on the interlayer insulating layer 20 by using a known process technique (FIG. 6).

Figure 7:
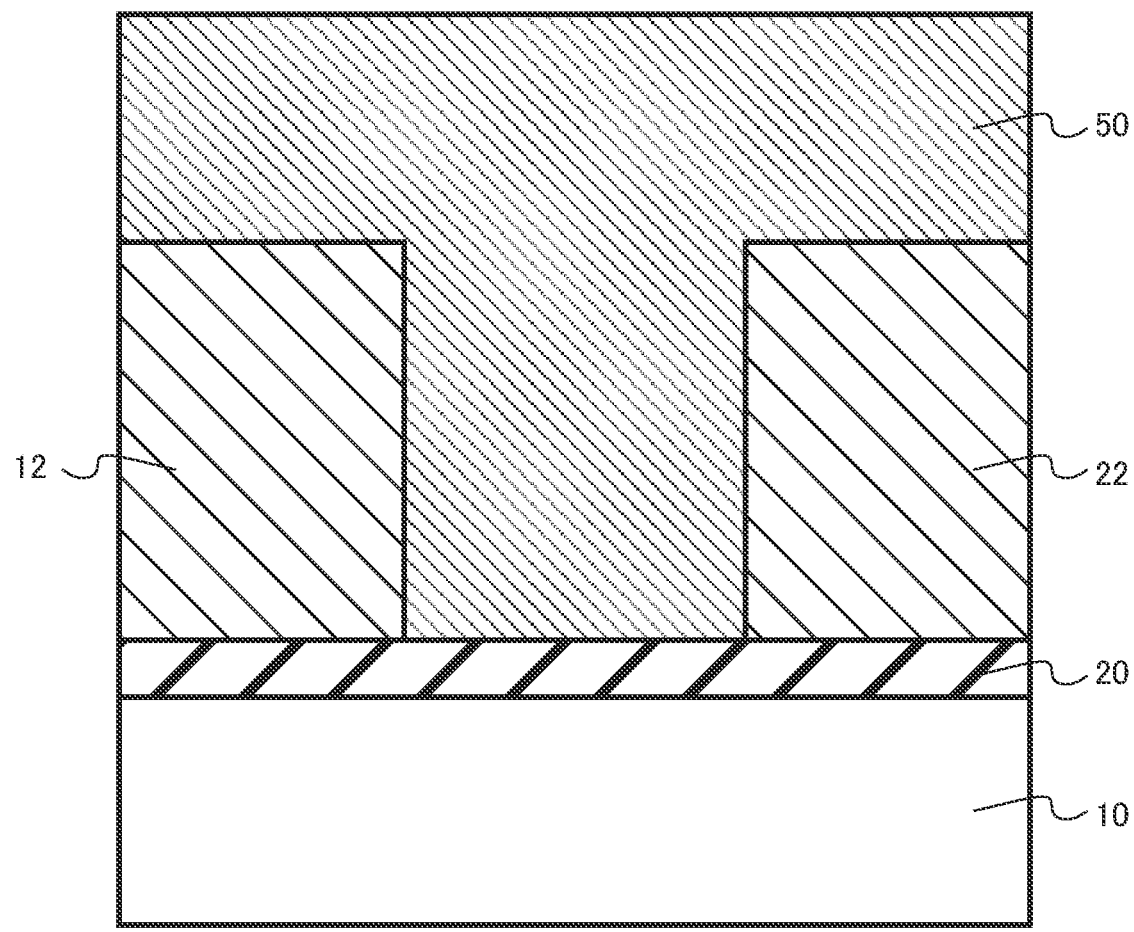
FIG. 7 is a schematic cross-sectional view showing an example of a method of manufacturing the semiconductor device of embodiments.

Then, a silicon oxide film 50 is formed (FIG. 7). The silicon oxide film 50 is formed so as to be buried between the source electrode 12 and the gate wiring 22. The silicon oxide film 50 is formed by using, for example, a chemical vapor deposition method (CVD method).

Figure 8:
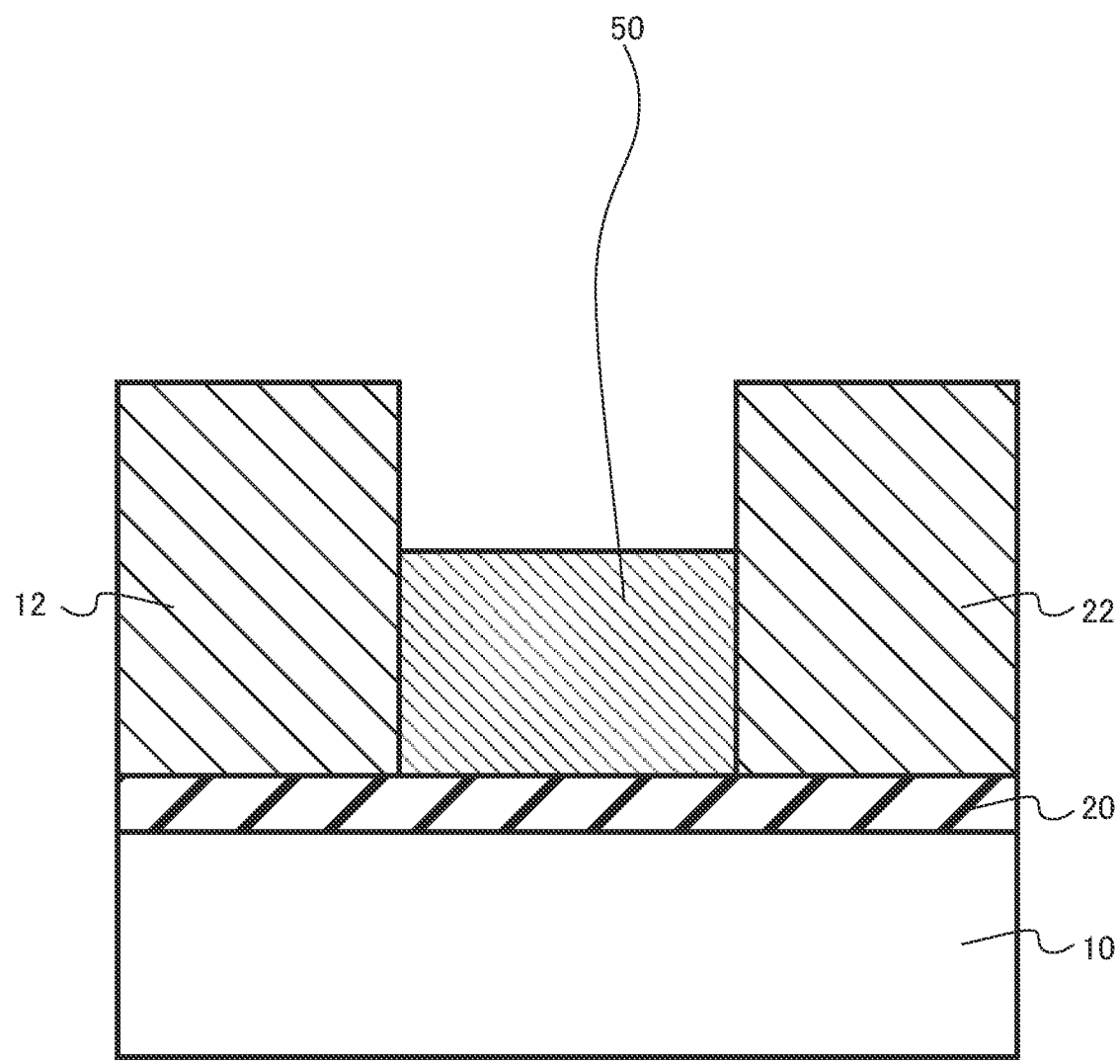
FIG. 8 is a schematic cross-sectional view showing an example of a method of manufacturing the semiconductor device of embodiments.

Then, the silicon oxide film 50 on the source electrode 12 and on the gate wiring 22 is removed (FIG. 8). The top surface of the source electrode 12 and the top surface of the gate wiring 22 are exposed. The silicon oxide film 50 is removed by using, for example, a reactive ion etching method (RIE method). The processed silicon oxide film 50 is an example of the second protective insulating layer 28.

Figure 9:
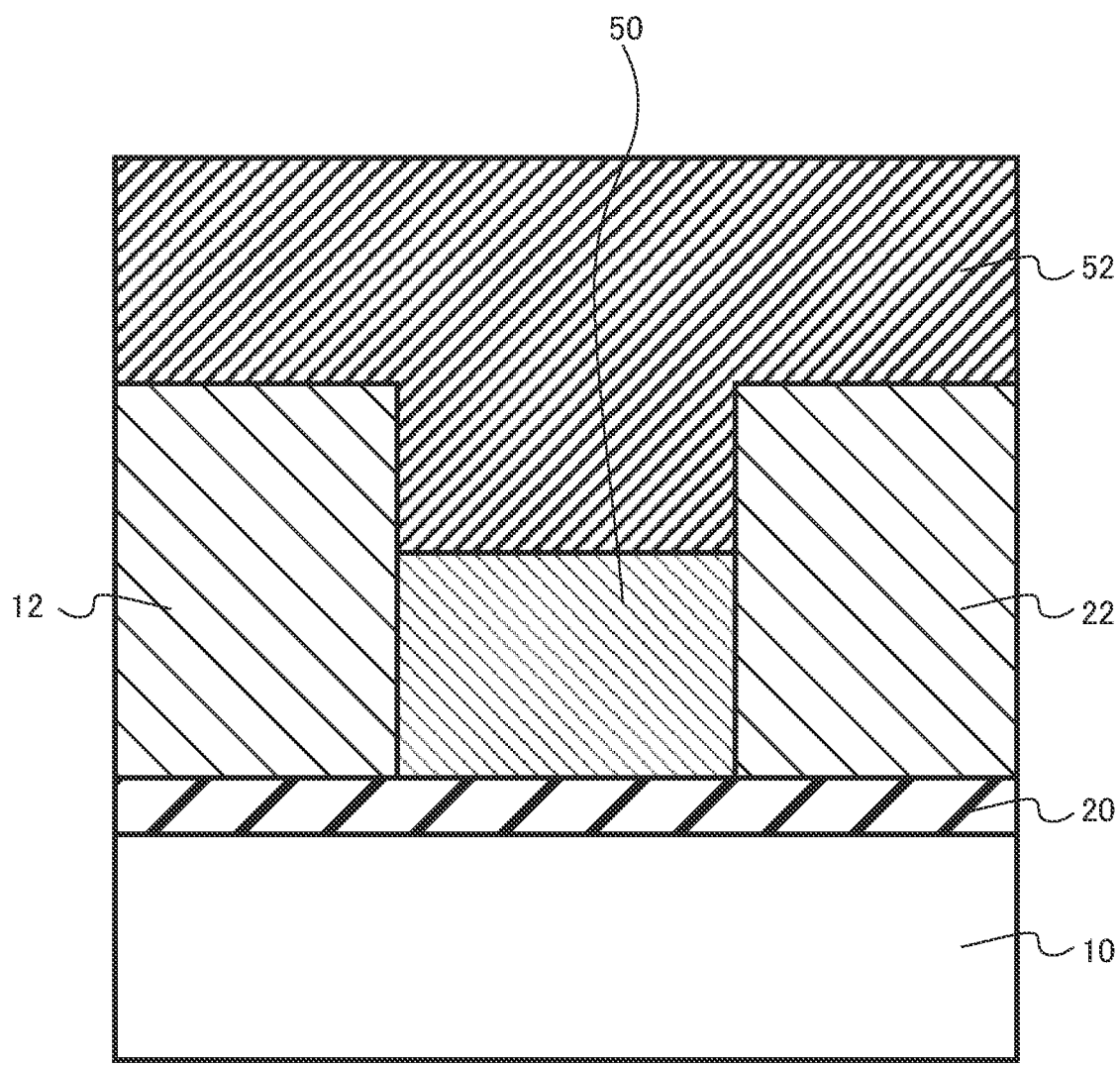
FIG. 9 is a schematic cross-sectional view showing an example of a method of manufacturing the semiconductor device of embodiments.

Then, a silicon nitride film 52 is formed (FIG. 9). The silicon nitride film 52 is formed so as to be buried between the source electrode 12 and the gate wiring 22. The silicon nitride film 52 is formed by using, for example, a CVD method.

Figure 10:
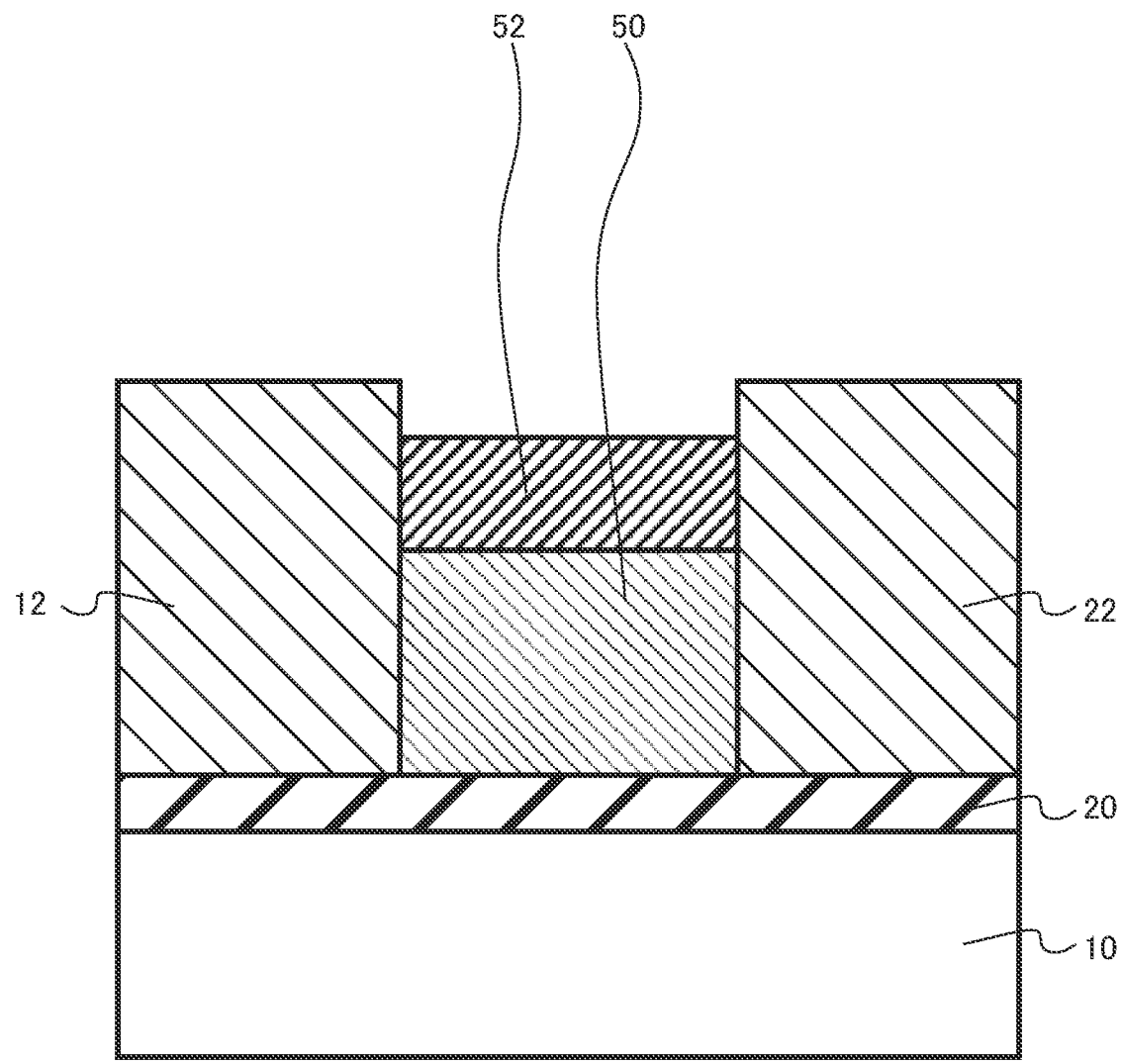
FIG. 10 is a schematic cross-sectional view showing an example of a method of manufacturing the semiconductor device of embodiments.

Then, the silicon nitride film 52 on the source electrode 12 and on the gate wiring 22 is removed (FIG. 10). The top surface of the source electrode 12 and the top surface of the gate wiring 22 are exposed. The silicon nitride film 52 is removed by using, for example, an RIE method. The processed silicon nitride film 52 is an example of the first protective insulating layer 26.

Figure 11:
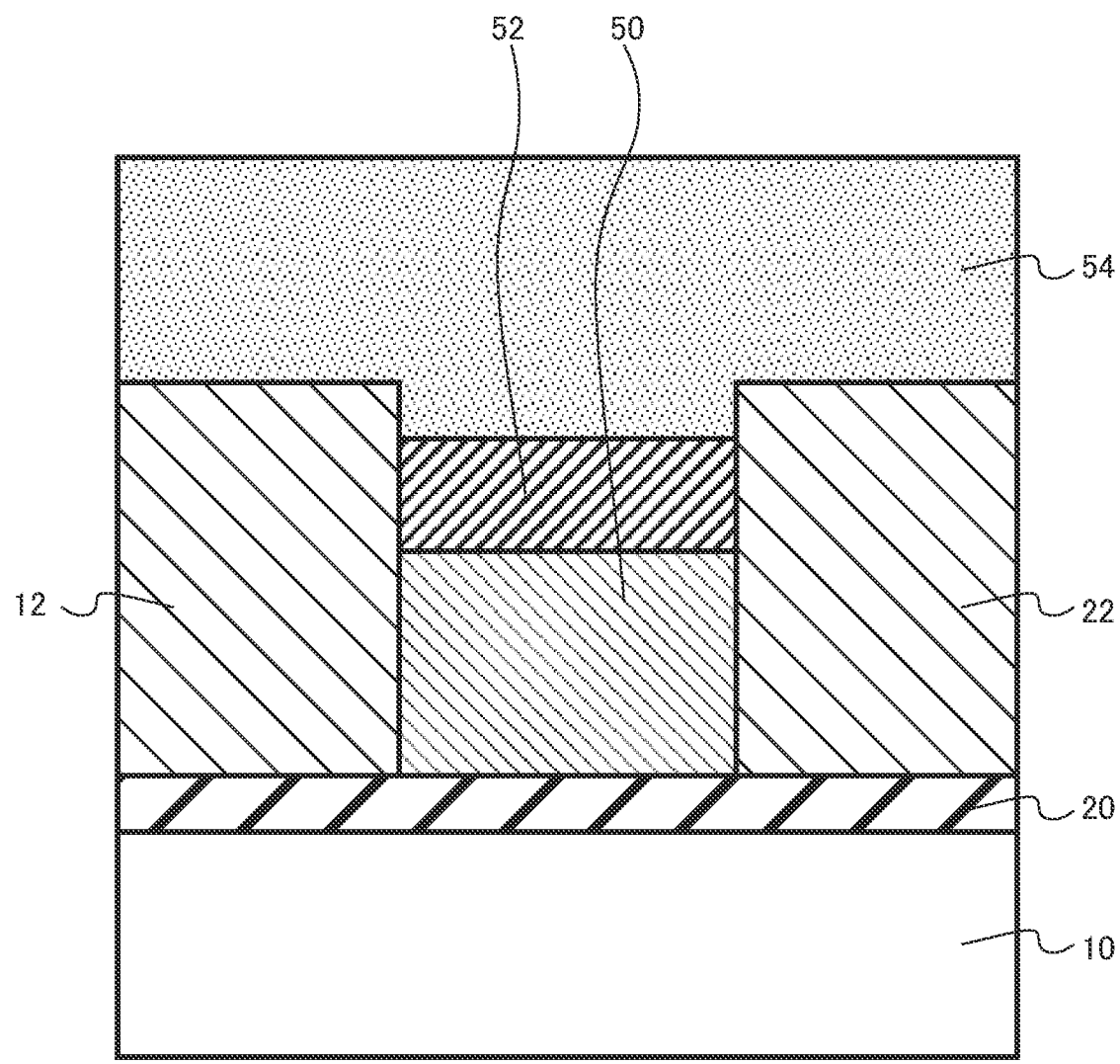
FIG. 11 is a schematic cross-sectional view showing an example of a method of manufacturing the semiconductor device of embodiments.

Then, a polyimide film 54 is formed (FIG. 11). Thereafter, a part of the polyimide film 54 on the source electrode 12 is removed. The polyimide film 54 is removed by, for example, wet etching. The processed polyimide film 54 is an example of the polyimide layer 30.

The semiconductor device of embodiments is manufactured by the above-described manufacturing method.

Next, the function and effect of the semiconductor device of embodiments will be described.

Figure 12:
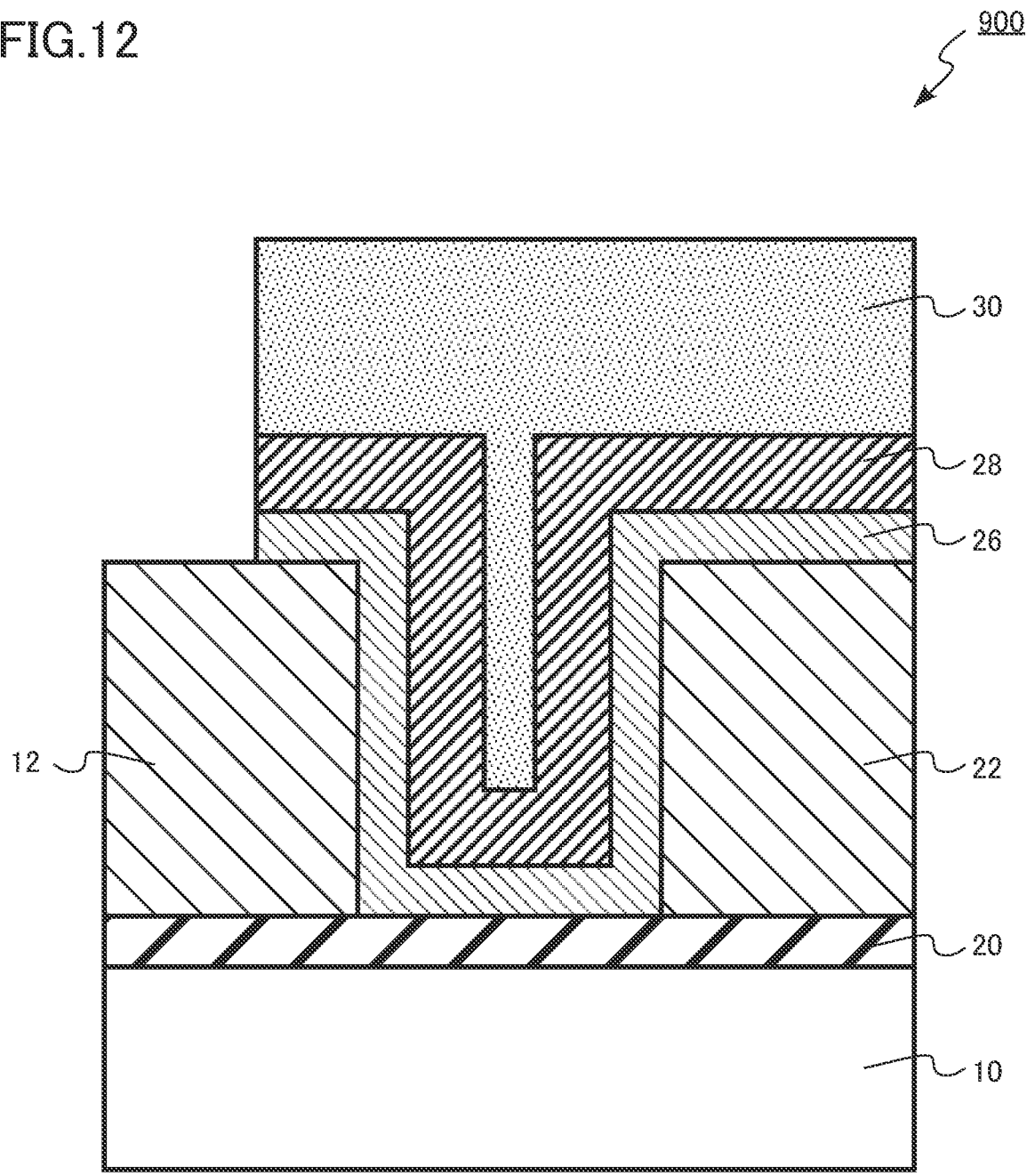
FIG. 12 is a schematic cross-sectional view of a semiconductor device of a comparative example.

FIG. 12 is a schematic cross-sectional view of a semiconductor device of a comparative example. The semiconductor device of the comparative example is a MOSFET 900. Similar to the MOSFET 100 of embodiments, the MOSFET 900 is a planar gate type vertical MOSFET for high breakdown voltage applications.

The MOSFET 900 of the comparative example is different from the MOSFET 100 of embodiments in that the first protective insulating layer 26 and the second protective insulating layer 28 are provided on the source electrode 12. In addition, the MOSFET 900 of the comparative example is different from the MOSFET 100 of embodiments in that the first protective insulating layer 26 and the second protective insulating layer 28 are provided on the gate wiring 22.

In the MOSFET 900, the first protective insulating layer 26 is in contact with the top surface and the side surface of the source electrode 12. The first protective insulating layer 26 and the second protective insulating layer 28 cover the corners of the top surface and the side surface of the source electrode 12.

In the MOSFET 900, the second protective insulating layer 28 is in contact with the top surface and the side surface of the gate wiring 22. The first protective insulating layer 26 and the second protective insulating layer 28 cover the corners of the top surface and the side surface of the gate wiring 22.

Figure 13:
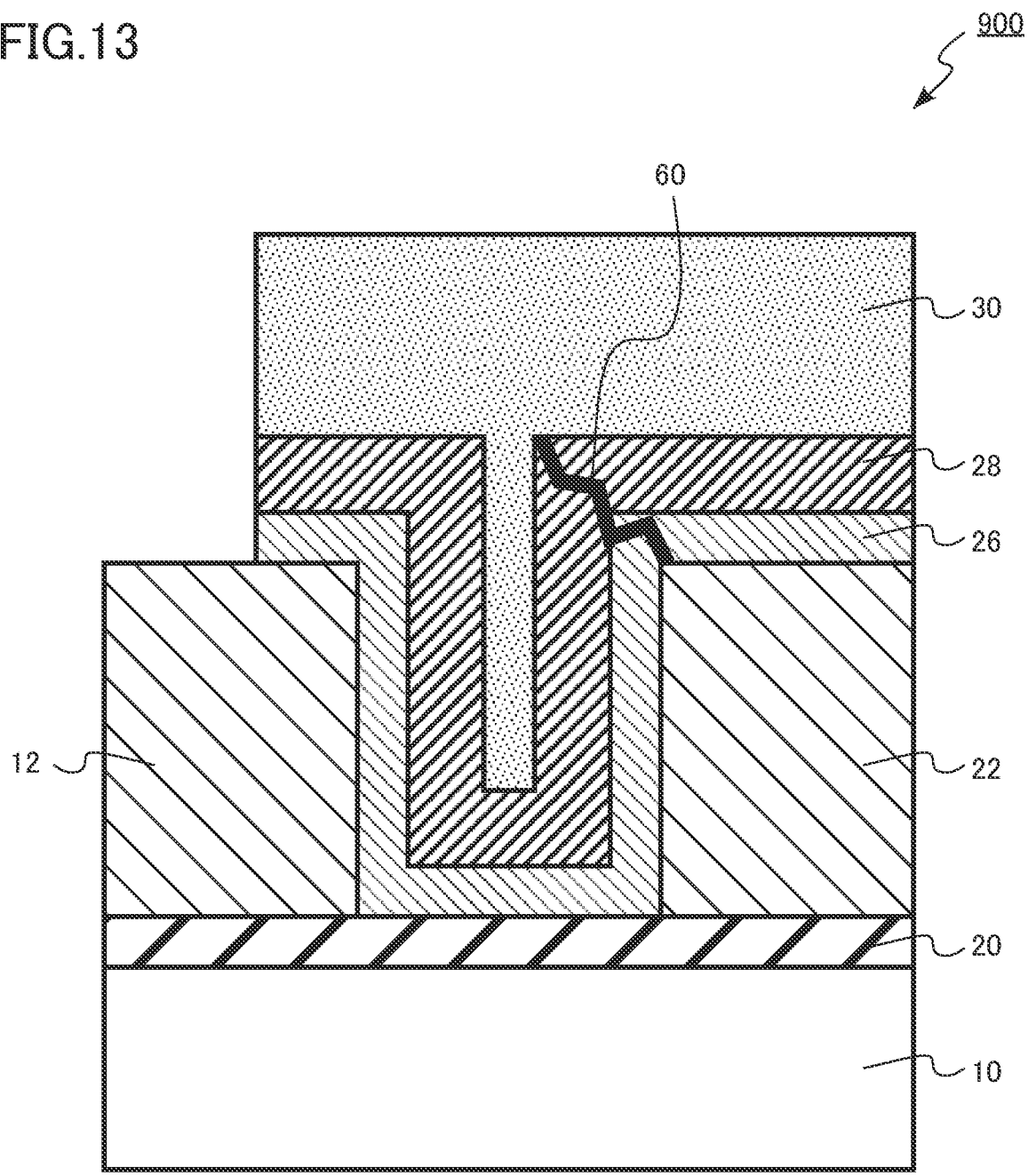
FIG. 13 is an explanatory diagram of a problem of the semiconductor device of the comparative example.

FIG. 13 is an explanatory diagram of a problem of the semiconductor device of the comparative example. For example, during the use of the MOSFET 900, the temperature of the MOSFET 900 changes. With the temperature change, stress is generated due to the difference between the thermal expansion coefficients of materials forming the MOSFET 900.

For example, as shown in FIG. 13, at the corner of the metal gate wiring 22, the stress applied to the first protective insulating layer 26 and the second protective insulating layer 28, which are insulating materials, increases due to the characteristic of the shape. Therefore, for example, as shown in FIG. 13, a crack 60 occurs in the first protective insulating layer 26 and the second protective insulating layer 28.

In particular, when the first protective insulating layer 26 formed of silicon nitride or silicon oxynitride is cracked, the invasion of moisture or movable ions from the outside increases. Therefore, the reliability of the MOSFET 900 is reduced.

Power semiconductor devices such as the MOSFET 900 are often used in hotter and more humid environments than, for example, logic devices or memory devices. In addition, the voltage applied to the device is high. Therefore, in a power semiconductor device, cracks are likely to occur in the protective insulating layer, and there is a great concern that the reliability will be reduced when the protective insulating layer is cracked.

In the MOSFET 100 of embodiments, the first protective insulating layer 26 and the second protective insulating layer 28 do not cover the corners of the top surface and the side surface of the source electrode 12. In addition, in the MOSFET 100, the first protective insulating layer 26 and the second protective insulating layer 28 do not cover the corners of the top surface and the side surface of the gate wiring 22.

Therefore, the occurrence of cracks at the corners of the source electrode 12 or the corners of the gate wiring 22 is suppressed. As a result, the invasion of moisture or movable ions from the outside is suppressed, and the reliability of the MOSFET 100 is improved.

The thickness t3 of the first protective insulating layer 26 is preferably smaller than the thickness t4 of the second protective insulating layer 28. The stress generated by the first protective insulating layer 26 containing nitrogen (N) is larger than, for example, the stress generated by the second protective insulating layer 28 containing no nitrogen (N). By reducing the thickness t3 of the first protective insulating layer 26, for example, the occurrence of stress migration of the gate wiring 22 is suppressed.

The first protective insulating layer 26 is preferably a silicon nitride layer. By forming the first protective insulating layer 26 as a silicon nitride layer, the invasion of moisture or movable ions from the outside is effectively suppressed.

The difference (s1 in FIG. 5) between the third distance d3 and the second distance d2 is preferably equal to or less than 1 µm. In addition, the difference (s2 in FIG. 5) between the fifth distance d5 and the fourth distance d4 is preferably equal to or less than 1 µm. For example, by setting the difference s1 and the difference s2 in the above range, the occurrence of cracks in the polyimide layer 30 at the corners of the source electrode 12 and the gate wiring 22 is suppressed.

First Modification Example

Figure 14:
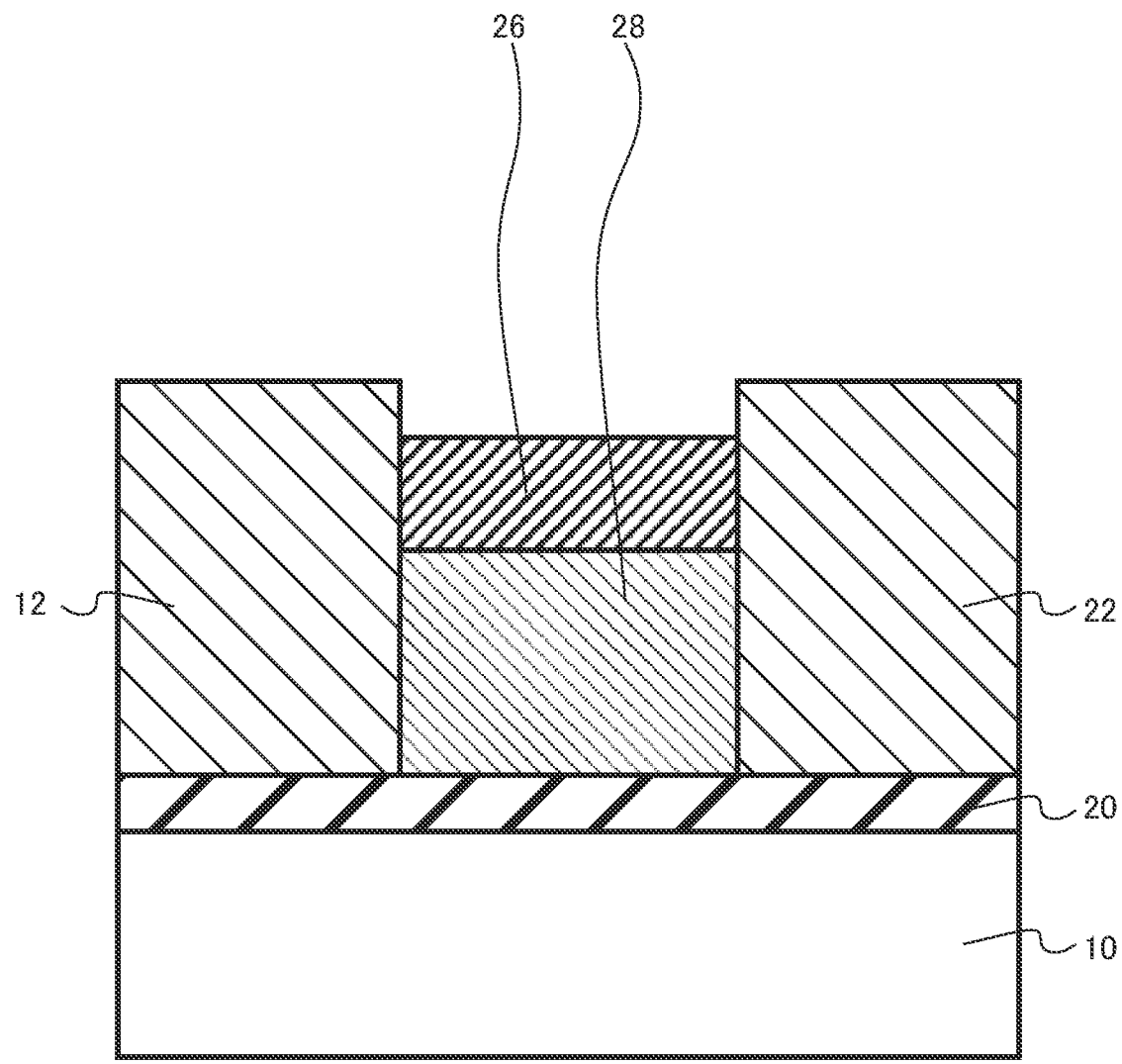
FIG. 14 is a schematic cross-sectional view of a first modification example of the semiconductor device of embodiments.

FIG. 14 is a schematic cross-sectional view of a first modification example of the semiconductor device of embodiments. FIG. 14 is a diagram corresponding to FIG. 5 of embodiments. The MOSFET of the first modification example is different from the MOSFET 100 of embodiments in that the polyimide layer 30 is not provided. The reliability of the MOSFET of the first modification example is improved by the same function as that of the MOSFET 100 of embodiments.

Second Modification Example

Figure 15:
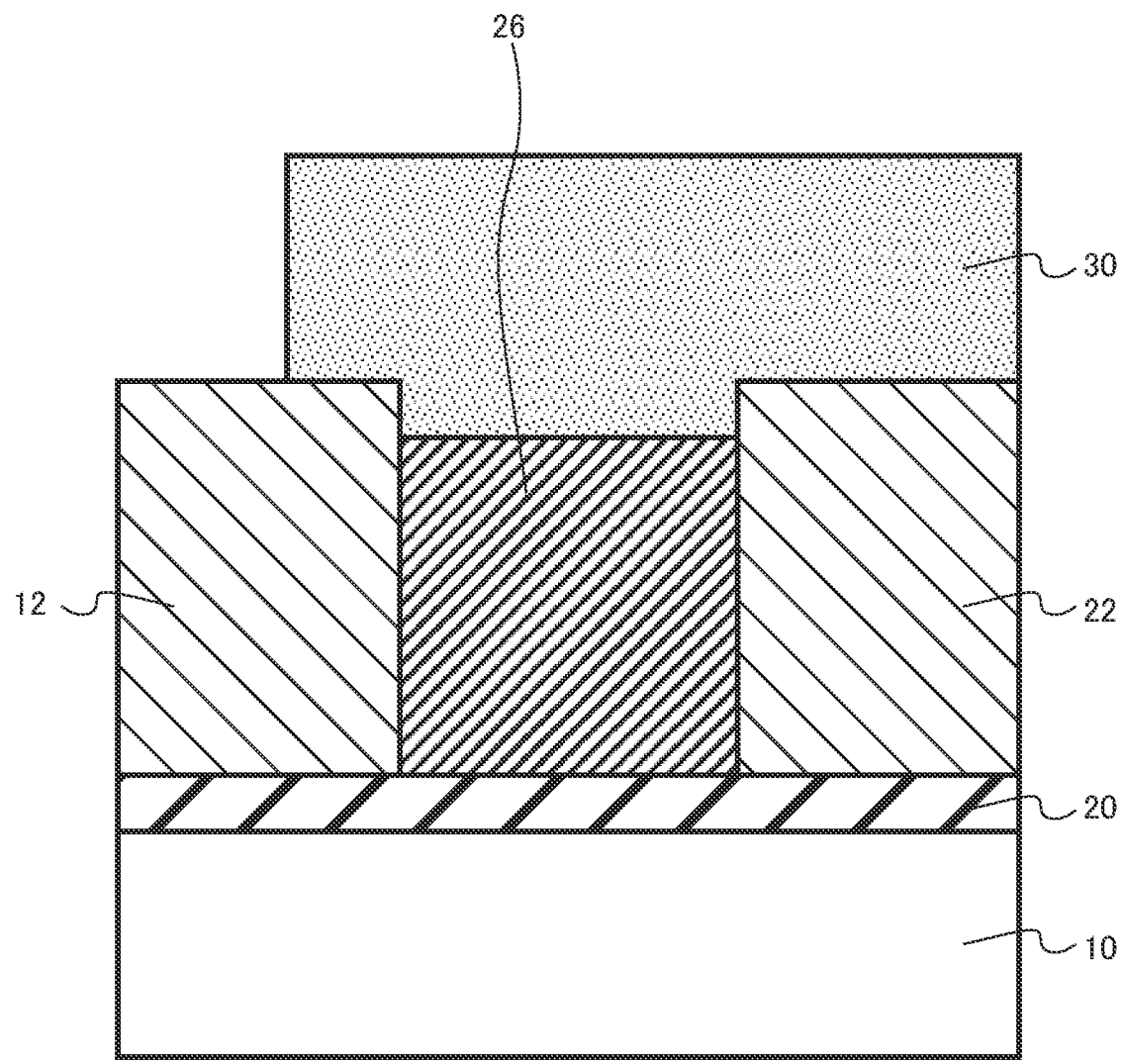
FIG. 15 is a schematic cross-sectional view of a second modification example of the semiconductor device of embodiments.

FIG. 15 is a schematic cross-sectional view of a second modification example of the semiconductor device of embodiments. FIG. 15 is a diagram corresponding to FIG. 5 of embodiments. The MOSFET of the second modification example is different from the MOSFET 100 of embodiments in that the second protective insulating layer 28 is not provided. The reliability of the MOSFET of the second modification example is improved by the same function as that of the MOSFET 100 of embodiments. In addition, by making the first protective insulating layer 26 thicker, the invasion of moisture or movable ions from the outside is effectively suppressed.

Third Modification Example

Figure 16:
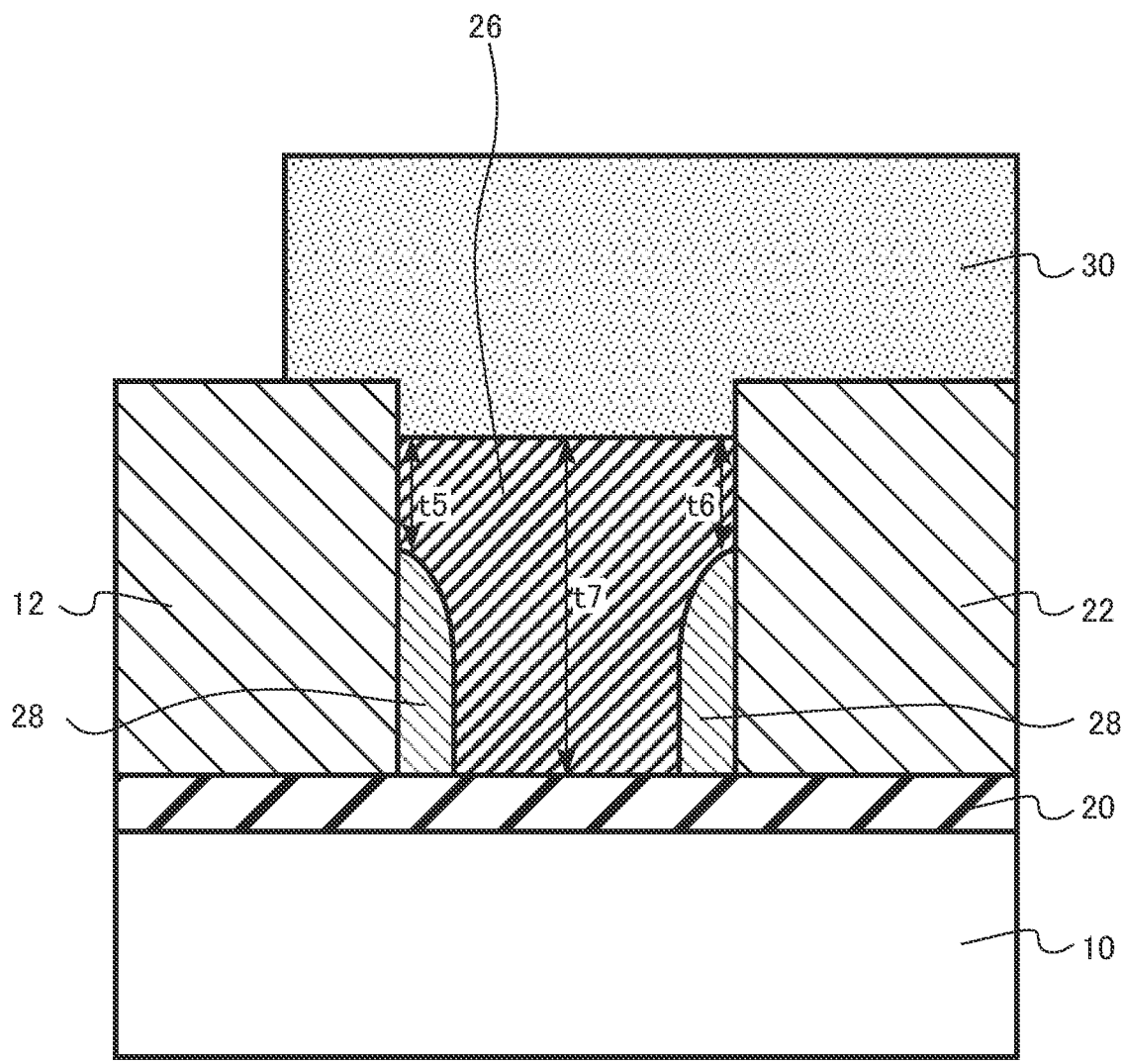
FIG. 16 is a schematic cross-sectional view of a third modification example of the semiconductor device of embodiments.

FIG. 16 is a schematic cross-sectional view of a third modification example of the semiconductor device of embodiments. FIG. 16 is a diagram corresponding to FIG. 5 of the embodiment. The MOSFET of the third modification example is different from the MOSFET of the second modification example in that the thickness (t5 in FIG. 16) of a portion of the first protective insulating layer 26 in contact with the source electrode 12 is smaller than the thickness (t7 in FIG. 16) of the first protective insulating layer 26 at an intermediate position between the source electrode 12 and the gate wiring 22. In addition, the MOSFET of the third modification example is different from the MOSFET of the second modification example in that the thickness (t6 in FIG. 16) of a portion of the first protective insulating layer 26 in contact with the gate wiring 22 is smaller than the thickness (t7 in FIG. 16) of the first protective insulating layer 26 at an intermediate position between the source electrode 12 and the gate wiring 22. The MOSFET of the third modification example is different from the MOSFET of the second modification example in that the second protective insulating layer 28 is provided on the side surface of the source electrode 12 and the side surface of the gate wiring 22.

The reliability of the MOSFET of the third modification example is improved by the same function as that of the MOSFET 100 of embodiments. In addition, for example, the occurrence of stress migration is suppressed by reducing the thickness t5 of a portion of the first protective insulating layer 26 in contact with the source electrode 12 and the thickness t6 of a portion of the first protective insulating layer 26 in contact with the gate wiring 22.

As described above, according to embodiments and its modification examples, it is possible to provide a semiconductor device with improved reliability by suppressing the occurrence of cracks in the protective insulating layer.

In embodiments, the case where the semiconductor layer is formed of silicon has been described as an example, but the semiconductor layer is not limited to the silicon. For example, the semiconductor layer may be formed of silicon carbide or nitride semiconductor.

In embodiments, the planar gate type vertical MOSFET has been described as an example, but embodiments can also be applied to, for example, a trench gate type vertical MOSFET. In addition, embodiments can also be applied to horizontal MOSFETs. In addition, embodiments can also be applied to semiconductor devices other than MOSFETs. For example, embodiments can be applied to an insulated gate bipolar transistor (IGBT), a diode, or a photocoupler.

In embodiments, the case where the resin layer is formed of polyimide has been described as an example, but the resin layer may be formed of other resins such as silicone.

In embodiments, the case where the first metal layer is a source electrode and the second metal layer is a gate wiring has been described as an example, but the first metal layer is not limited to the source electrode and the second metal layer is not limited to the gate wiring.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a semiconductor layer;
   a first insulating layer provided on the semiconductor layer;
   a first metal layer provided directly on the first insulating layer and containing aluminum (Al);
   a second metal layer provided directly on the first insulating layer and containing aluminum (Al); and
   a second insulating layer provided on the first insulating layer, the second insulating layer provided between the first metal layer and the second metal layer, the second insulating layer having a top surface in contact with a side surface of the first metal layer and a side surface of the second metal layer, and the second insulating layer containing silicon (Si) and nitrogen (N).

2. The semiconductor device according to claim 1, further comprising:
   a resin layer provided on the first metal layer, the second metal layer, and the first insulating layer.

3. The semiconductor device according to claim 1, further comprising:
   a third insulating layer provided between the first insulating layer and the second insulating layer, the third insulating layer provided between the first metal layer and the second metal layer, and the third insulating layer containing silicon (Si) and oxygen (O).

4. The semiconductor device according to claim 3, wherein a thickness of the second insulating layer is smaller than a thickness of the third insulating layer.

5. The semiconductor device according to claim 3, wherein a thickness of a portion of the second insulating layer in contact with the first metal layer is smaller than a thickness of the second insulating layer at an intermediate position between the first metal layer and the second metal layer.

6. The semiconductor device according to claim 1, wherein the second insulating layer contains oxygen (O).

7. The semiconductor device according to claim 1, wherein a distance between the first metal layer and the second metal layer is equal to or more than 1 µm and equal to or less than 10 µm.

8. The semiconductor device according to claim 1, wherein a thickness of the first metal layer and a thickness of the second metal layer are equal to or more than 1 µm and equal to or less than 10 µm.

9. The semiconductor device according to claim 1, further comprising:
   a gate electrode provided between the semiconductor layer and the first insulating layer.

10. The semiconductor device according to claim 1, further comprising:
    a third metal layer, the semiconductor layer being provided between the third metal layer and the first metal layer.

* * * * *